United States Patent
Tsutsumi et al.

(10) Patent No.: US 8,274,342 B2
(45) Date of Patent: Sep. 25, 2012

(54) DUPLEXER AND ELECTRONIC DEVICE

(75) Inventors: Jun Tsutsumi, Tokyo (JP); Kazuhiro Matsumoto, Tokyo (JP); Shogo Inoue, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/167,620

(22) Filed: Jun. 23, 2011

(65) Prior Publication Data

US 2011/0254639 A1   Oct. 20, 2011

Related U.S. Application Data

(63) Continuation of application No. PCT/JP2008/073752, filed on Dec. 26, 2008.

(51) Int. Cl.
*H03H 7/46* (2006.01)
*H04B 1/48* (2006.01)
*H03H 9/70* (2006.01)

(52) U.S. Cl. ....... 333/126; 333/129; 333/132; 333/133; 455/78; 455/82; 455/83

(58) Field of Classification Search .................. 333/126, 333/129, 132–135; 455/78, 82, 83
See application file for complete search history.

(56) References Cited

U.S. PATENT DOCUMENTS

| | | | | |
|---|---|---|---|---|
| 4,247,836 A * | 1/1981 | Redwood et al. | ............ | 333/195 |
| 4,931,755 A * | 6/1990 | Sakamoto et al. | ............ | 333/193 |
| RE37,639 E | 4/2002 | Ehara et al. | | |
| 6,472,959 B1 * | 10/2002 | Beaudin et al. | ............... | 333/193 |
| 6,525,624 B1 * | 2/2003 | Hikita et al. | ................... | 333/133 |
| 6,566,981 B2 | 5/2003 | Urabe et al. | | |
| 6,759,924 B2 * | 7/2004 | Sakuragawa et al. | ......... | 333/133 |
| 6,917,258 B2 | 7/2005 | Kushitani et al. | | |
| 6,940,368 B2 | 9/2005 | Plessky et al. | | |
| 6,972,644 B2 | 12/2005 | Nishizawa et al. | | |
| 7,030,716 B2 * | 4/2006 | Tsutsumi et al. | ............. | 333/133 |
| 7,154,359 B2 * | 12/2006 | Inoue et al. | ................... | 333/193 |
| 7,164,306 B2 | 1/2007 | Makino | | |

(Continued)

FOREIGN PATENT DOCUMENTS

EP   1 480 337 A1   11/2004

(Continued)

OTHER PUBLICATIONS

Machine Translation of JP 11-251861, published Sep. 17, 1999.*

(Continued)

*Primary Examiner* — Barbara Summons
(74) *Attorney, Agent, or Firm* — Chen Yoshimura LLP (57) ABSTRACT

A duplexer includes a transmission filter connected between a common terminal and a transmission terminal, a reception filter connected between the common terminal and a reception; and a capacitor connected in parallel with the transmission filter and the reception filter between the transmission terminal and the reception terminal and has a capacitance so that a phase difference between a signal passing from the transmission terminal to the reception terminal through the transmission filter and the reception filter and a signal passing from the transmission terminal to the reception terminal through the capacitor, or connected in parallel with the reception filter between the common terminal and the reception terminal and has a capacitance so that a phase difference between a signal passing from the common terminal to the reception terminal through the reception filter and a signal from the common terminal to the reception terminal through the capacitor.

6 Claims, 13 Drawing Sheets

U.S. PATENT DOCUMENTS

| | | |
|---|---|---|
| 7,479,850 B2 | 1/2009 | Kearns et al. |
| 7,554,419 B2 | 6/2009 | Inoue et al. |
| 2001/0043024 A1 | 11/2001 | Takamine et al. |
| 2002/0014121 A1 | 2/2002 | Urabe et al. |
| 2002/0158708 A1 | 10/2002 | Inoue et al. |
| 2003/0112768 A1 | 6/2003 | Frank |
| 2004/0070469 A1 | 4/2004 | Plessky et al. |
| 2004/0219888 A1 | 11/2004 | Iwamoto et al. |
| 2004/0233019 A1 | 11/2004 | Inoue et al. |
| 2005/0046520 A1 | 3/2005 | Nishizawa et al. |
| 2005/0281210 A1 | 12/2005 | Makino |
| 2006/0091977 A1 | 5/2006 | Inoue et al. |
| 2007/0001786 A1 | 1/2007 | Kundu |
| 2007/0268092 A1 | 11/2007 | Inoue et al. |
| 2008/0007370 A1 | 1/2008 | Matsumoto |
| 2009/0058557 A1 | 3/2009 | Tsurunari et al. |
| 2009/0273408 A1 | 11/2009 | Inoue et al. |
| 2010/0026414 A1 | 2/2010 | Iwaki et al. |
| 2010/0026419 A1 | 2/2010 | Hara et al. |
| 2010/0109800 A1 | 5/2010 | Ueda et al. |
| 2010/0150075 A1 | 6/2010 | Inoue et al. |
| 2010/0244979 A1* | 9/2010 | Matsuda et al. .............. 333/100 |

FOREIGN PATENT DOCUMENTS

| | | |
|---|---|---|
| EP | 1 482 639 A2 | 12/2004 |
| EP | 1 653 615 A1 | 5/2006 |
| EP | 1 860 773 A2 | 11/2007 |
| EP | 1883159 A1 | 1/2008 |
| JP | 60-043808 A | 3/1985 |
| JP | 60-126809 A | 7/1985 |
| JP | 4-249906 A | 9/1992 |
| JP | 5-055855 A | 3/1993 |
| JP | 06-152317 A | 5/1994 |
| JP | 7-226602 A | 8/1995 |
| JP | 09-167937 A | 6/1997 |
| JP | 11-214908 A | 8/1999 |
| JP | 11-251861 * | 9/1999 |
| JP | 11-346142 A | 12/1999 |
| JP | 2000-022493 A | 1/2000 |
| JP | 2001-186033 A | 7/2001 |
| JP | 2002-76829 A | 3/2002 |
| JP | 2002-84165 A | 3/2002 |
| JP | 2003-249841 A | 9/2003 |
| JP | 2004-523176 A | 7/2004 |
| JP | 2004-336181 A | 11/2004 |
| JP | 2004-349893 A | 12/2004 |
| JP | 2005-045099 A | 2/2005 |
| JP | 2005-184773 A | 7/2005 |
| JP | 2006-60747 A | 3/2006 |
| JP | 2006-135447 A | 5/2006 |
| JP | 2006-135921 A | 5/2006 |
| JP | 2006-311041 A | 11/2006 |
| JP | 2007-312324 A | 11/2007 |
| WO | 02/071610 A1 | 9/2002 |
| WO | 2006/118039 A1 | 11/2006 |
| WO | 2009/025106 A1 | 2/2009 |
| WO | 2010/073377 A1 | 7/2010 |

OTHER PUBLICATIONS

English language machine translation of JP 2001-186033, published Jul. 6, 2001.*
O'Sullivan et al.; "Adaptive Duplexer Implemented Using Feedforward Technique With a BST Phase Shifter"; 2004 IEEE MTT-S International Microwave Symposium Digest, vol. 3, pp. 1299-1302, Jun. 6-11, 2004, and IEEE Xplore Abstract page one.*
International Search Report (ISR) issued in PCT/JP2008/073752 (parent application) mailed in Mar. 2009 for Examiner consideration, citing U.S. Patent Application Publication Nos. 1 and 3 and Foreign Patent document Nos. 3-8 listed above.
Written Opinion (PCT/ISA/237) issued in PCT/JP2008/073752 (parent application) mailed in Mar. 2009. Concise explanation of relevance: This Written Opinion considers the claims are described by or obvious over the U.S. Patent Application Publication Nos. 1 and 3, and Foreign Patent document Nos. 3-7 cited in ISR above.
U.S. Appl. No. 12/564,648, filed Sep. 22, 2009.
U.S. Appl. No. 12/709,182, filed Feb. 19, 2010.
International Search Report (ISR) issued in PCT/JP2008/058416 mailed in Aug. 2008.
English translation of Written Opinion (PCT/ISA/237) issued in PCT/JP2008/073752 in Aug. 2011.

* cited by examiner

FIG. 13

DUPLEXER AND ELECTRONIC DEVICE

CROSS-REFERENCE TO RELATED APPLICATION

This application is a continuation application of PCT/JP2008/073752 filed Dec. 26, 2008, the contents of which are herein wholly incorporated by reference.

FIELD

A certain aspect of the present invention relates to duplexers and electronic devices.

BACKGROUND

Recently, downsizing of radio communication terminals, which may be typically cellular phones, has progressed. For downsizing, it is studied to reduce the number of parts used in the radio communication terminals. The number of parts used in the radio communication terminals may be achieved by omitting an interstage filter provided in a transmission path or a reception path. However, it is required to improve the isolation characteristic between a transmission terminal of a duplexer and a reception terminal thereof.

Japanese Patent Application Publication Nos. 2006-60747 and 2002-76879 describe improvements in the isolation characteristic of the duplexer by removal of unwanted electromagnetic couplings.

SUMMARY OF THE INVENTION

According to an aspect of the present invention, there is provided a duplexer including: a transmission filter connected between a common terminal and a transmission terminal; a reception filter connected between the common terminal and a reception terminal; and a capacitor connected in parallel with either the transmission filter or the reception filter between at least two terminals Out of the common terminal, the transmission terminal and the reception terminal.

DETAILED DESCRIPTION

Figure 1:
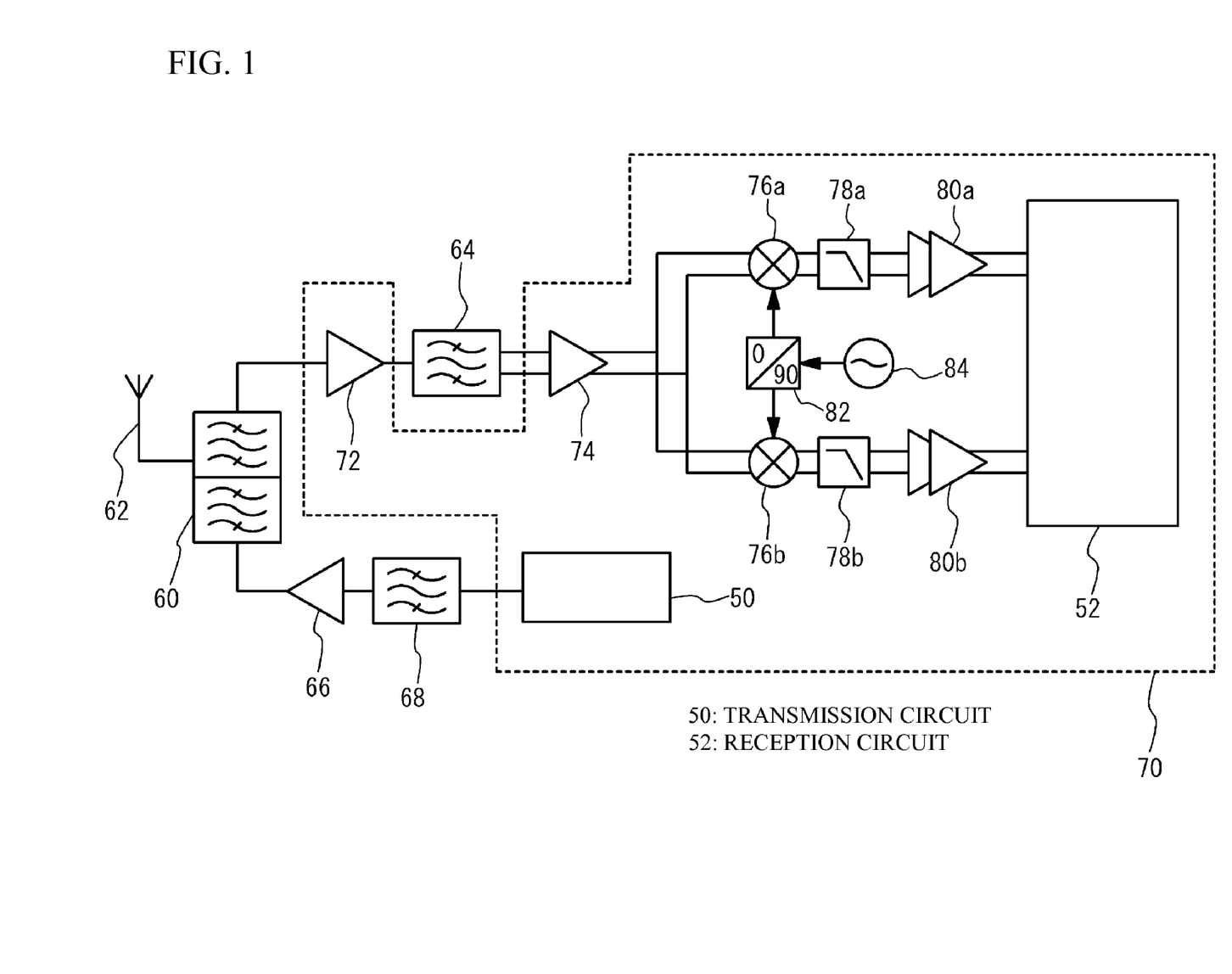
FIG. 1 is a block diagram of a cellular phone.

First, a description is given of the reason why the duplexer is required to have improvement in the isolation characteristic. FIG 1 is a diagram of an RE (Radio Frequency) block of a cellular phone. Referring to FIG. 1, the cellular phone has a duplexer 60, an antenna 62, a power amplifier 66, interstage filters 64 and 68, and a transceiver IC 70. The transceiver IC has a reception circuit 52, a transmission circuit 50, low noise amplifiers 72 and 74, mixers 76a and 76b, low-pass filters 78a and 78b, variable gain amplifiers 80a and 80b, a 90° hybrid circuit 82. and an oscillator 84. The transmission circuit 50 generates a transmission signal, The interstage filter 68 passes the transmission signal, and suppresses signals having frequencies other than the frequencies of the transmission signal. The power amplifier 66 amplifies the transmission signal. The duplexer 60 outputs the transmission signal to the antenna 62, and does not output the transmission signal to the reception side. The antenna 62 transmits the transmission signal.

The antenna 62 receives a reception signal. The duplexer 60 outputs the reception signal to the reception side, and does not output the reception signal to the transmission side. The low noise amplifiers 72 and 74 amplify the reception signal. The interstage filter 64 passes the reception signal and suppresses signals having frequencies other than those of the reception signal. The interstage filter 64 converts an unbalanced signal to balanced signals. The 90° hybrid circuit 82 shifts the phase of an oscillation signal output by the oscillator 84 by 90° and applies the 90° phase shifted oscillation signals to the mixers 76a and 76b, respectively. The mixers 76a and 76b mix the reception signals with the oscillation signals, The low pass filters 78a and 78b pass down-converted reception signals and suppress carrier signals. The reception circuit 52 processes the received signals.

Figure 2:
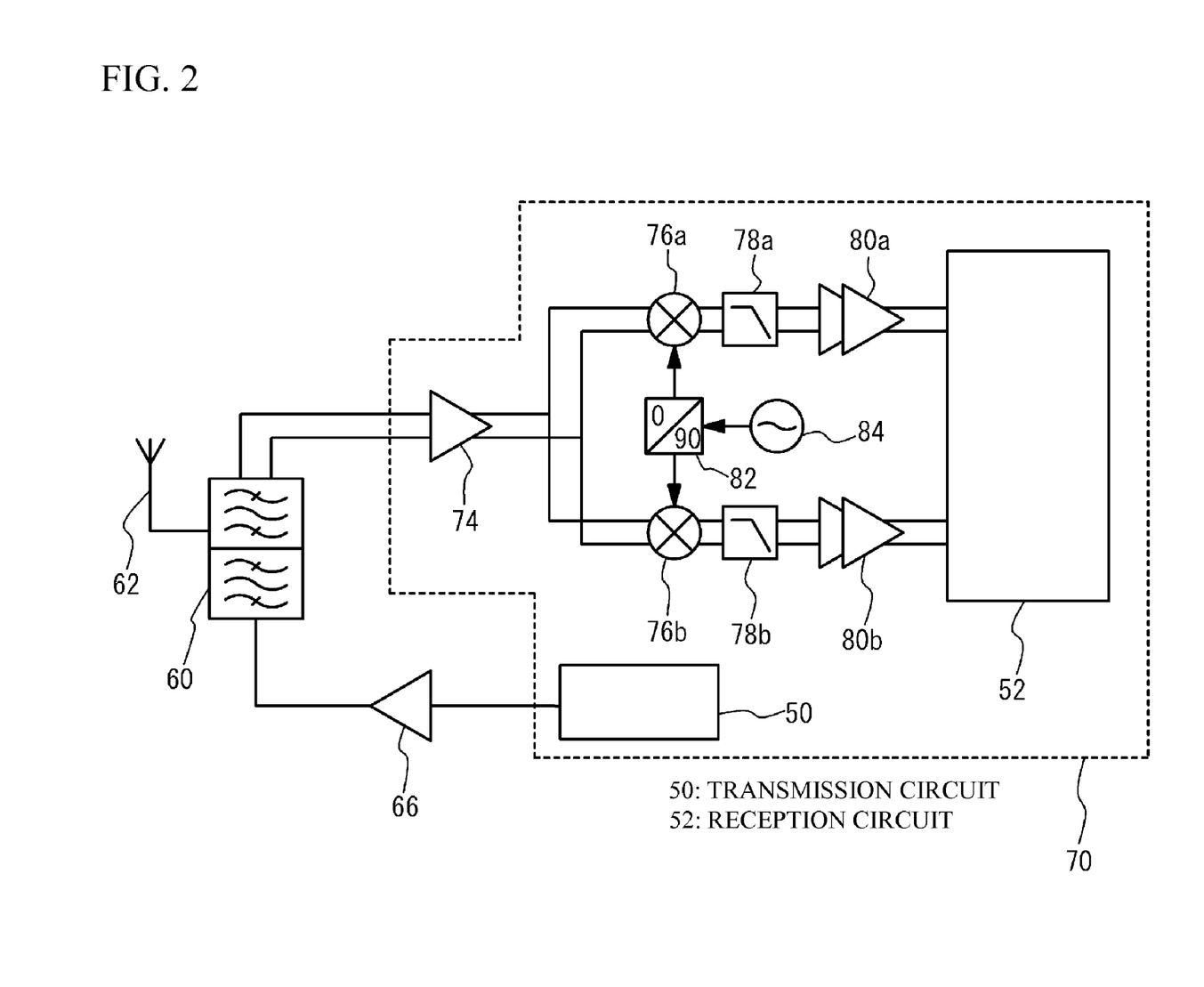
FIG. 2 is a block diagram of a supposed cellular phone in future.

For downsizing and cost reduction of the cellular phones, a circuit as illustrated in FIG. 2 is desired. Referring to FIG. 2, the interstage filters 64 an 68 and the low noise amplifier 72 illustrated in FIG. 1 are removed, and the duplexer 60 performs the conversion to the balanced signals, The removal of the interstage filters 64 and 68 causes the duplexer 60 to take over the functions of the interstage filters. That is, the filter in the duplexer 60 is required to have suppression performance corresponding to two filters. Particularly, it is required to improve the isolation characteristic of the duplexer.

Figure 3:
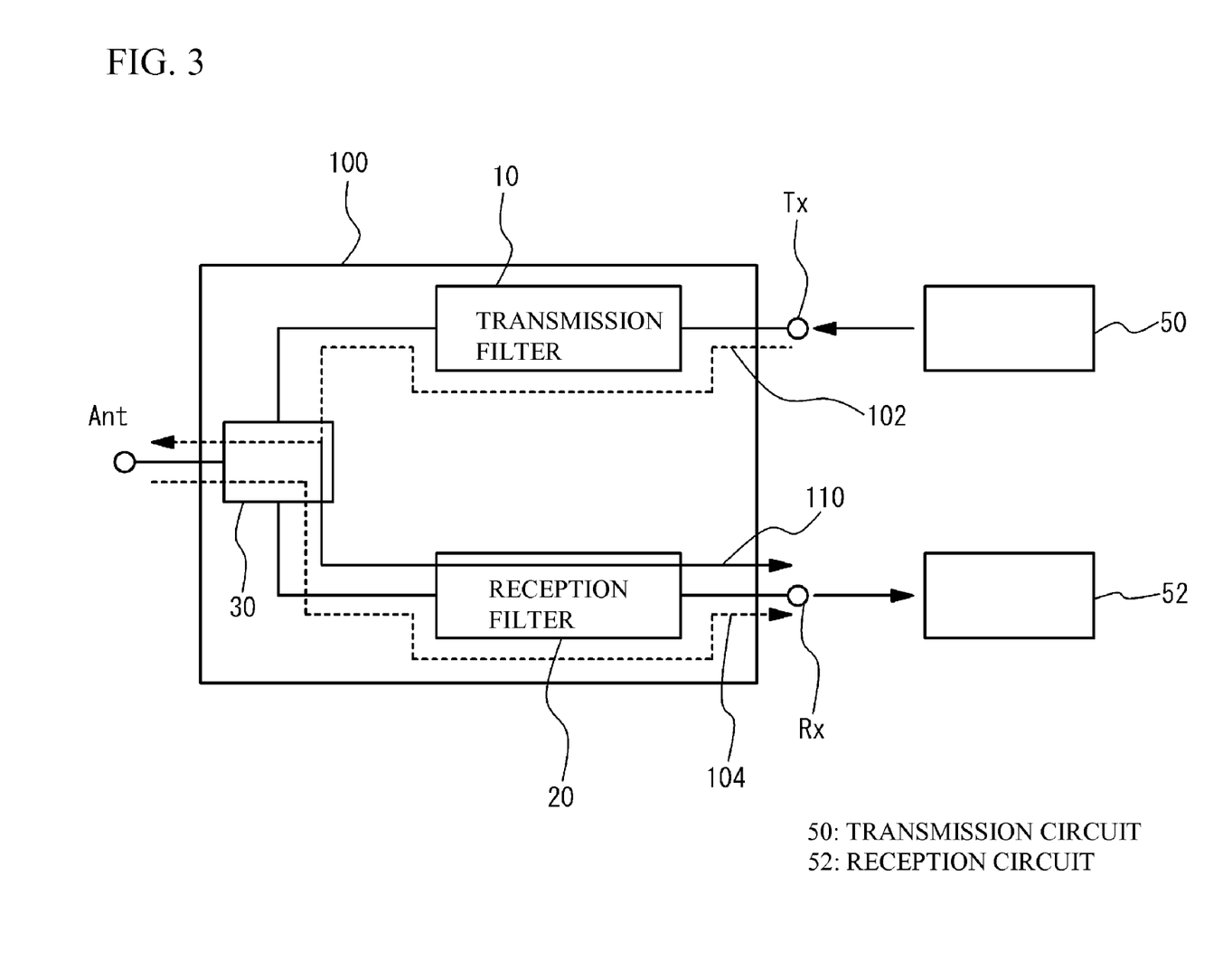
FIG. 3 is a block diagram of a conventional duplexer.

FIG. 3 is a block diagram of a duplexer. In a duplexer 100, a transmission filter 10 is connected between a common terminal Ant and a transmission terminal Tx, A reception filter 20 is provided between the common terminal Ant and a reception terminal Rx. A matching circuit 30 is provided between the transmission filter 10 and the common terminal Ant and between the reception filter 20 and the common terminal Ant. The transmission circuit 50 and the reception circuit 52 are connected to the transmission terminal Tx and the reception terminal Rx, respectively.

As indicated by a dashed line 102, the transmission filter 10 passes the signals in the transmission band among the signals that are input via the transmission terminal Tx towards the common terminal Ant, and suppresses signals having other frequencies. As indicated by a dashed line 104, the reception filter 20 passes the signals in the reception band among the signals that are input via the common terminal Ant, and suppresses signals having other frequencies, The matching circuit 30 establishes impedance matching that causes the transmission signal passing through the transmission filter 10 to be output from the common terminal Ant without leaking to the reception filter 20 side. As described above, ideally, the transmission signal input to the transmission terminal Tx is output to the common terminal Ant via the transmission filter 10 and the matching circuit 30, and is not output to the reception terminal Rx. However, as indicated by a signal 110 in FIG. 3, some of the power of the transmission signal passes through the matching circuit 30 and the reception filter 20 and is output to the reception terminal Rx. The power of the signal input to the transmission terminal Tx is very higher than the power of the reception signal input to the common terminal Ant. It is thus required to reduce the ratio of the transmission signal output to the reception terminal Rx to a very small value. The ratio of power leak to the reception terminal Rx to the power of the transmission signal input to the transmission terminal Tx is referred to as isolation between the transmission terminal and the reception terminal.

Figure 4:
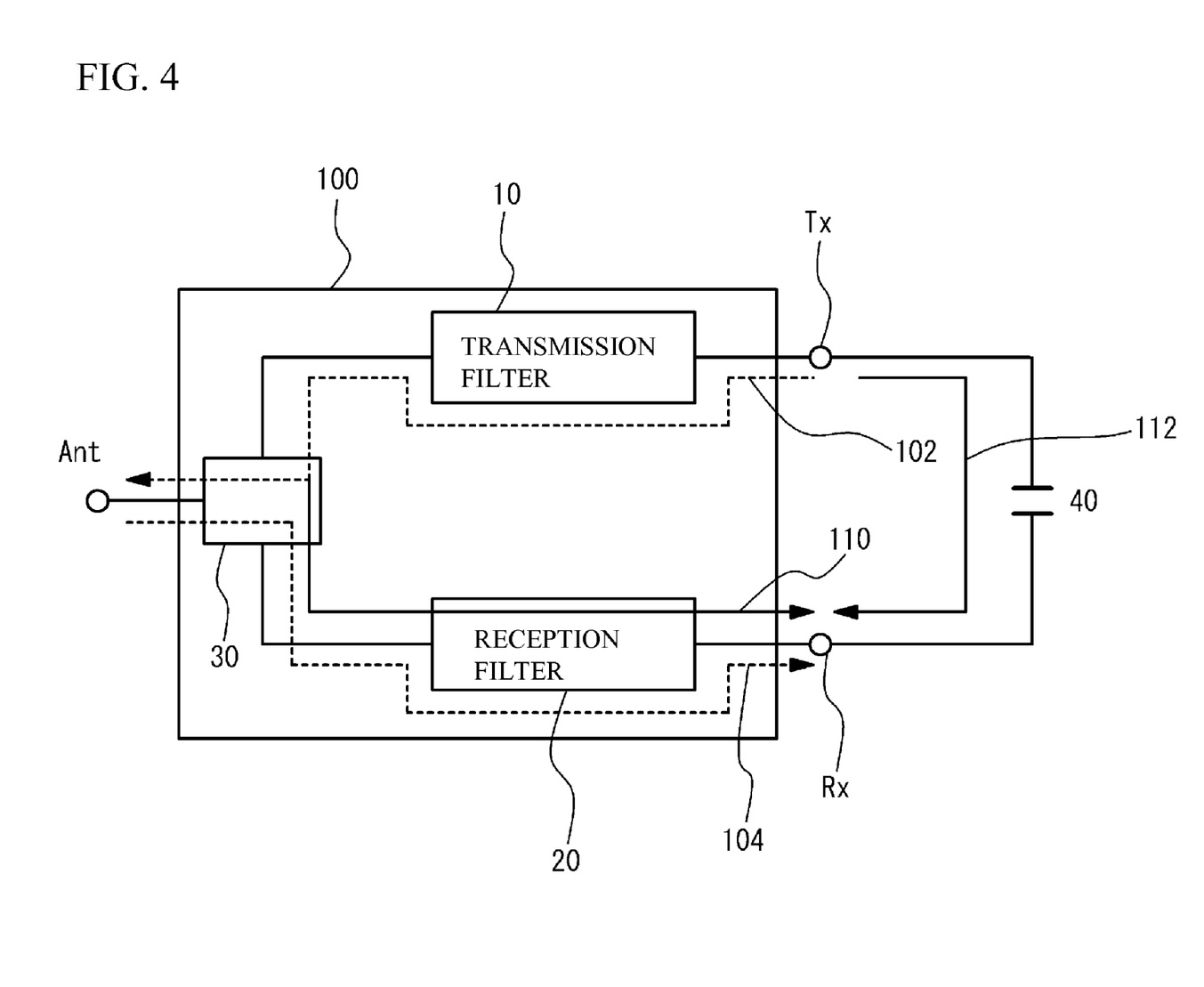
FIG. 4 is a block diagram that describes the principle.

The principle of improvement of the isolation characteristic is described below. FIG. 4 is a block diagram for describing the principle of improving the isolation characteristic. Referring to FIG. 4, a capacitor 40 is connected in parallel with the reception filter 20 and the transmission filter 10 between the transmission terminal Tx and the reception terminal Rx. The other structures are the same as those in FIG. 3 and a description thereof is omitted here. Since a capacitive coupling between the transmission terminal Tx and the reception terminal Rx is made, part of the transmission signal reaches the reception terminal Rx from the transmission terminal Tx via the capacitor 40, as indicated as a signal 112 in FIG. 4. The capacitor 40 couples the transmission terminal Tx and the reception terminal Rx with each other at RF frequencies (for example, 800 MHz~2.5 GHz used in cellular phones), and disconnects these terminals from each other in DC.

Figure 5:
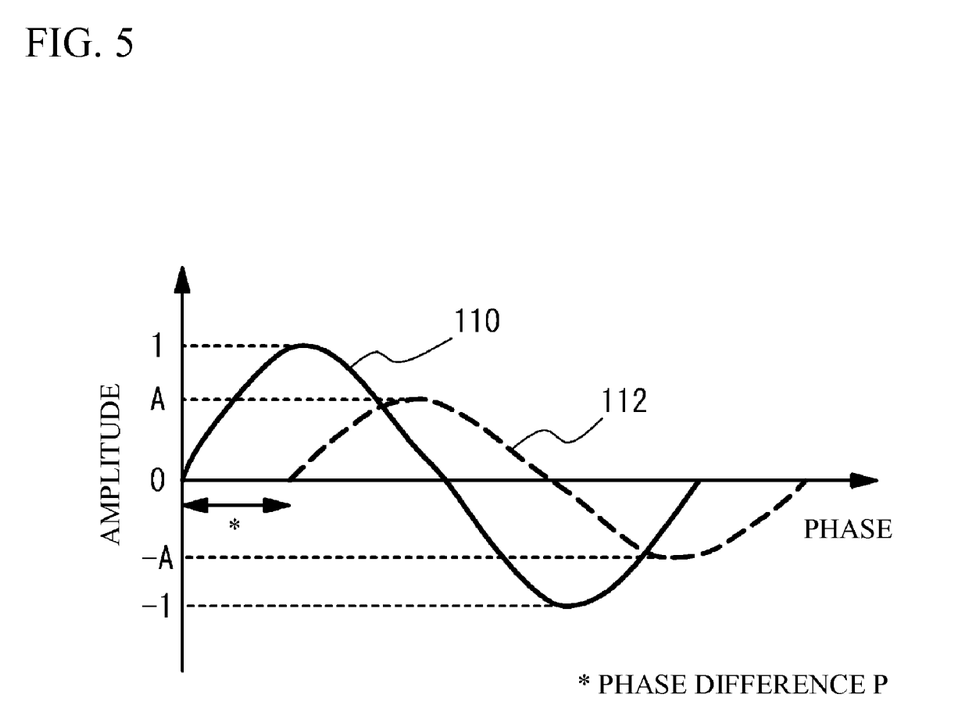
FIG. 5 is a diagram that describes an amplitude and a phase difference.

FIG. 5 is a diagram that illustrates a relationship between the signal 110 and the signal 112, It is assumed that the amplitude of the signal 112. normalized by the amplitude of the signal 110 is denoted as A, and the phase difference between the signals 110 and 112 is denoted as P. Solid lines illustrated in FIGS. 6(*a*) through 6(*d*) indicate normalized power associated with the phase difference P, the normalized power being obtained by normalizing (during one cycle) the power of the signals 110 and 112 after combining by the power of the signal 110 (dashed lines) before combining. That is, the normalized power that is less than 1 indicates that the isolation characteristic is improved by the signal 112. FIGS. 6(*a*) through 6(*d*) respectively show cases where the amplitude A of the signal 112 is 1.0, 0.75, 0.5 and 0.25.

According to FIG. 6(*a*), for an amplitude A of 1 the isolation characteristic is improved within the range of 180±60° in the phase difference P According to FIG. 6(*b*), for an amplitude A of 0.75, the isolation characteristic is improved within the range of approximately 180±65' in the phase difference P. According to FIG. 6(*c*), for an amplitude A of 0.5, the isolation characteristic is improved within the range of approximately 180±75° in the phase difference P. According to FIG. 6(*d*), for an amplitude A of 0.25, the isolation characteristic is improved within the range of approximately 180±85° in the phase difference.

Figure 6A:
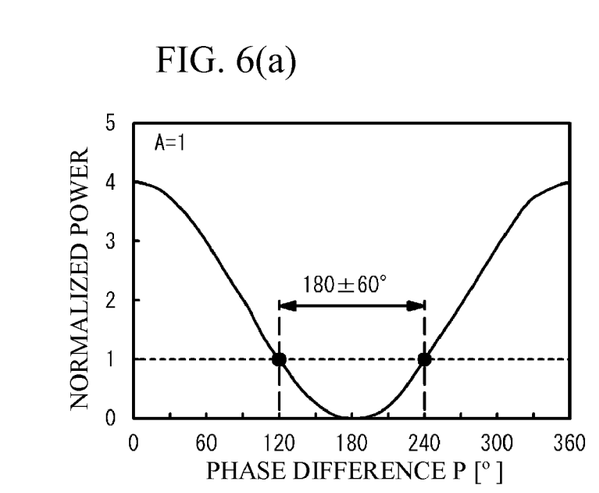
FIGS. 6(a) through 6(d) are diagrams that illustrate normalized power associated with the phase difference.
Figure 6B:
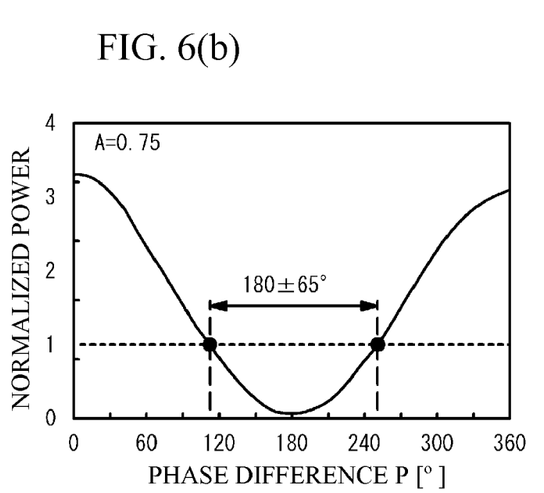
Figure 6C:
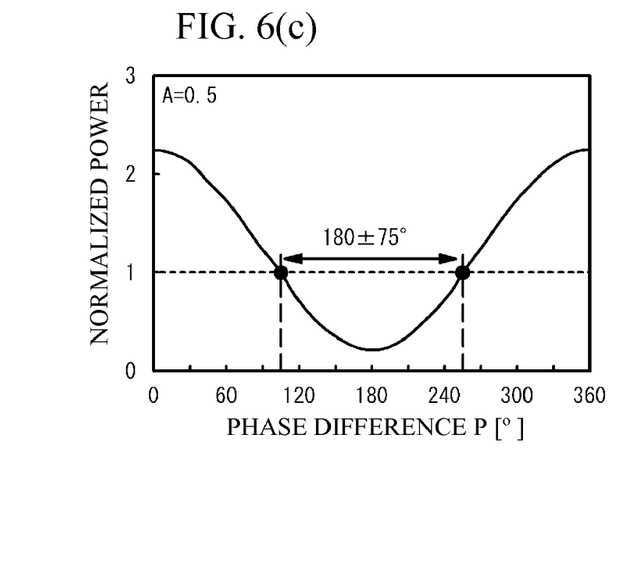
Figure 6D:
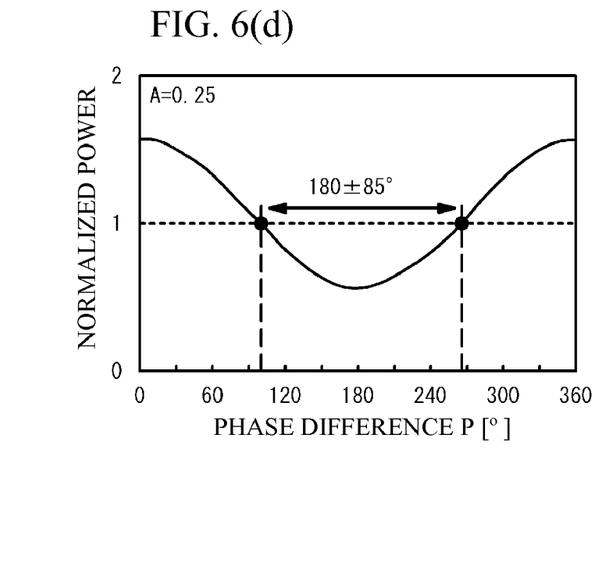

As described above, when the phase difference P is 180°, the isolation characteristic has the greatest improvement. When the phase difference P is not 180° but is close to 180°, the isolation characteristic is improved. In the case where the amplitude A is 1 as illustrated in FIG. 6(*a*), the isolation characteristic is improved within the range of ⅓ (120°) of the total phase difference)(360°). As illustrated in FIG. 6(*b*), in the case where the amplitude A is 0.25, the isolation characteristic is improved within the range of approximately ½ (170°) of the total phase difference (360°), As described above, the addition of the capacitor 40 is capable of improving the isolation characteristic with a probability of at least ½~⅓.

The amplitude A may be controlled by the capacitance value of the capacitor 40. In order to improve the isolation characteristic considerably; it is preferable that the amplitude A is 1. In order to enlarge the range of the phase difference P in which the isolation characteristic is improved, it is preferable that the amplitude A is smaller than 1.

The phase difference P results from the difference between the phase of the signal 112 that shifts by the capacitor 40 and the phase of the signal 110 that shifts by the transmission filter 10, the matching circuit 30 and the reception filter 20. The phase of the signal 112 that shifts by the capacitor 40 is small because the capacitance value is small. The phase of the signal 110 that shifts by the transmission filter 10. the matching circuit 30 and the reception filter 20 is comparatively large. Thus, there is a high possibility that the phase difference P may be within the ranges in which the isolation characteristic is improved illustrated in FIGS. 6(*a*) through 6(*d*) without a particular phase control. From a viewpoint of the isolation characteristic, it is preferable to connect a phase shift circuit that shifts the phase of the transmission band to the transmission filter 10 or the reception filter 20 in series and the phase difference P is made close to 180°. However, from viewpoints of downsizing and cost reduction, it is preferable that the phase shift circuit is not provided. As described above, the isolation characteristic can be improved simply by connecting the capacitance between the terminals.

Embodiments are described below with reference to the drawings.

Embodiment 1

Figure 7:
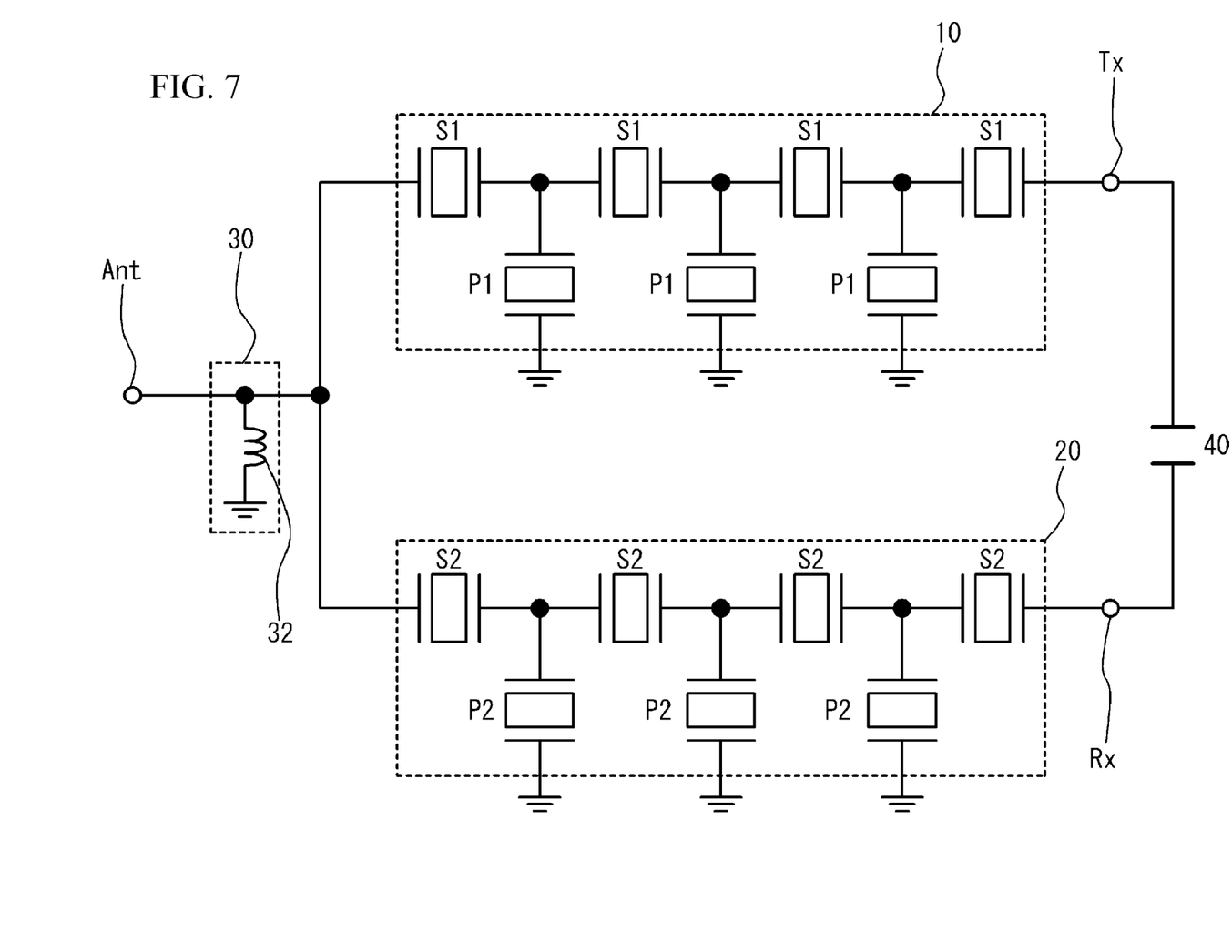
FIG. 7 is a diagram of a duplexer in accordance with an embodiment 1.

FIG. 7 is a diagram of a circuit configuration of a duplexer in accordance with an embodiment 1. The transmission filter 10 and the reception filter 20 are ladder type filters. in the transmission filter 10 series resonators S1 and parallel resonators P1 are arranged in the form of a ladder. Similarly, in the reception filter 20, series resonators S2 and parallel resonators P2 are arranged in the form of a ladder. The transmission filter 10 and the reception filter 20 used in a simulation are respectively ladder type filters in which six stages are connected. The series resonators S1 and S2 and the parallel resonators P1 and P2 use piezoelectric thin-film resonators (FBAR: Film Bulk Acoustic wave Resonator). Instead, these resonators may be surface acoustic wave (SAW: Surface Acoustic Wave) resonators or SMRs (Solidly Mounted Resonators).

The matching circuit 30 is connected between the common terminal Ant and the transmission filter 10 and between the common terminal Ant and the reception filter 20. The matching circuit 30 has an inductor 32 connected between the common terminal Ant and ground. The capacitor 40 is connected in parallel with the transmission filter 10 and the reception filter 20 between the transmission terminal Tx and the reception terminal Rx.

The isolation characteristic was simulated in such a way that the pass band of the transmission filter 10 was set to 1920 MHz~1980 MHz, and the pass band of the reception filter 20 was set to 2110~2170 MHz, supposing duplexers used in W-CDMA (Wideband Code Division Multiple Access). In the embodiment 1, the ratio Cpt/Cst between the capacitance Cpt of parallel resonators P1 of the transmission filter 10 and the capacitance Cst of the series resonators S1 thereof is set equal to 0.3. The ratio Cpr/Csr between the capacitance Cpr of the parallel resonators P2 of the reception filter 20 and the capacitance Csr of the series resonators S2 thereof is set equal to 0.5. The capacitance of the capacitor 40 is set to 1.5 fF, and the inductance of the inductor 32 is set to 6 nH, In a comparative example 1, the capacitor 40 is not connected.

Figure 8:
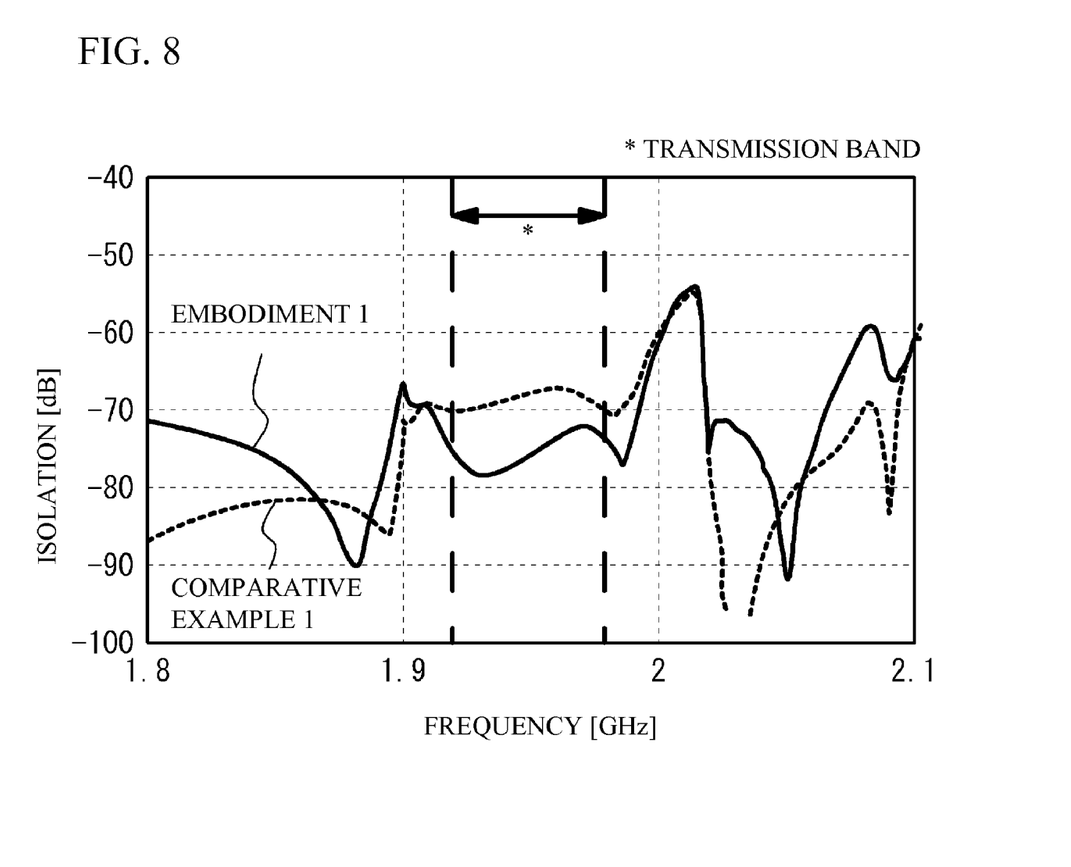
FIG. 8 is a diagram that illustrates isolation characteristics of the embodiment 1 and comparative example 1.

FIG. 8 is a diagram illustrating simulation results of the isolation characteristic of the embodiment 1 (solid line) and the isolation characteristic of the comparative example 1 (dashed line) of the comparative example that does not have the capacitor 40. As illustrated in FIG. 8, the embodiment 1 is capable of improving the isolation characteristic by 3~9 dB over the whole transmission range, as compared with the comparative example 1.

Figure 9:
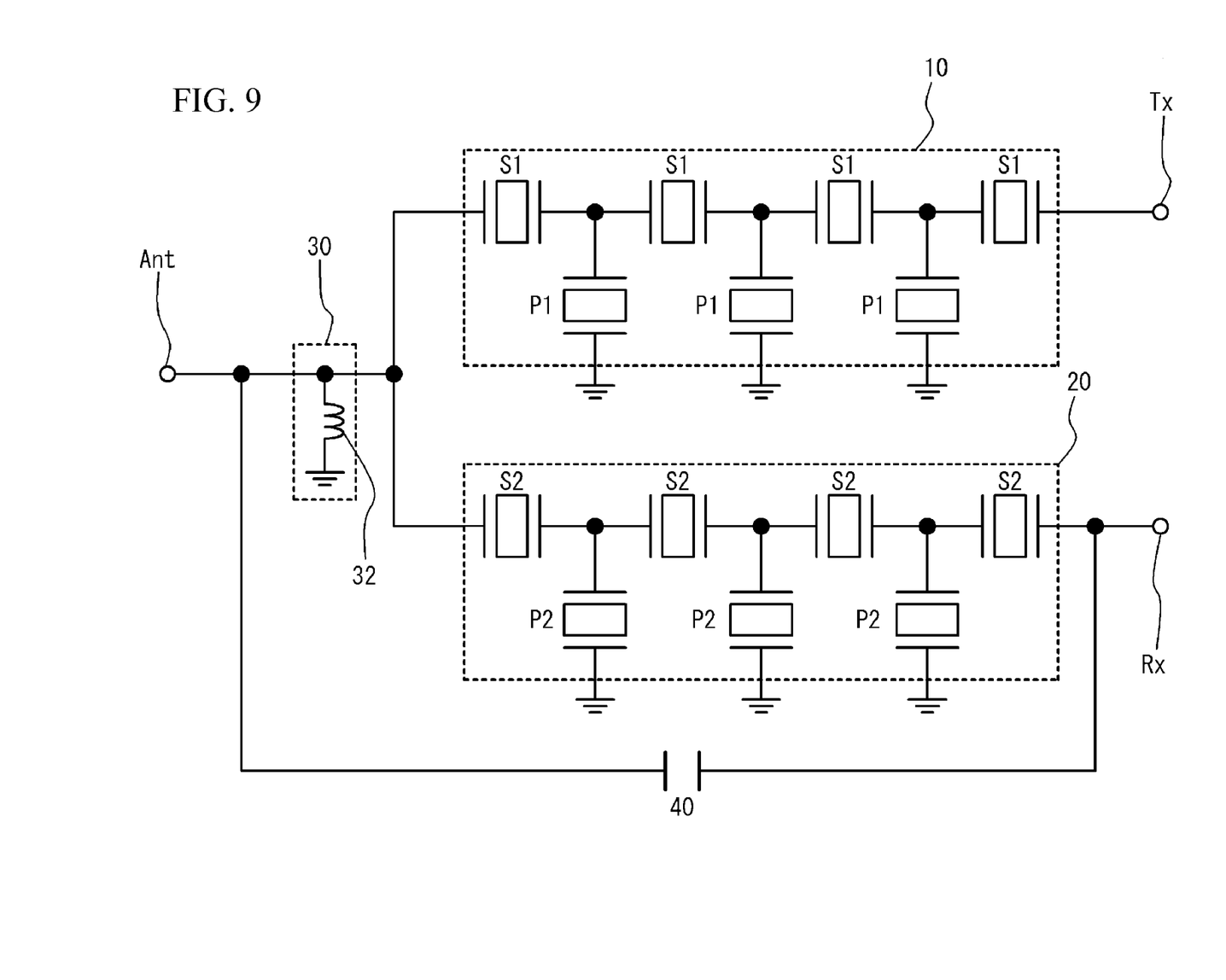
FIG. 9 is a diagram that illustrates another duplexer in accordance with the embodiment 1.

FIG. 9 illustrates another example of the embodiment 1. As illustrated in FIG. 9, the capacitor 40 may be connected in parallel with the reception filter 20 between the common terminal Ant and the reception terminal Rx. In the example of FIG. 9, some of the power of the transmission signal applied to the common terminal Ant reaches the reception terminal Rx via the capacitor 40. This signal is capable of canceling the transmission signal that leaks from the reception filter 20 and reaches the reception terminal Rx. Thus, the isolation characteristic can be improved.

Figure 10:
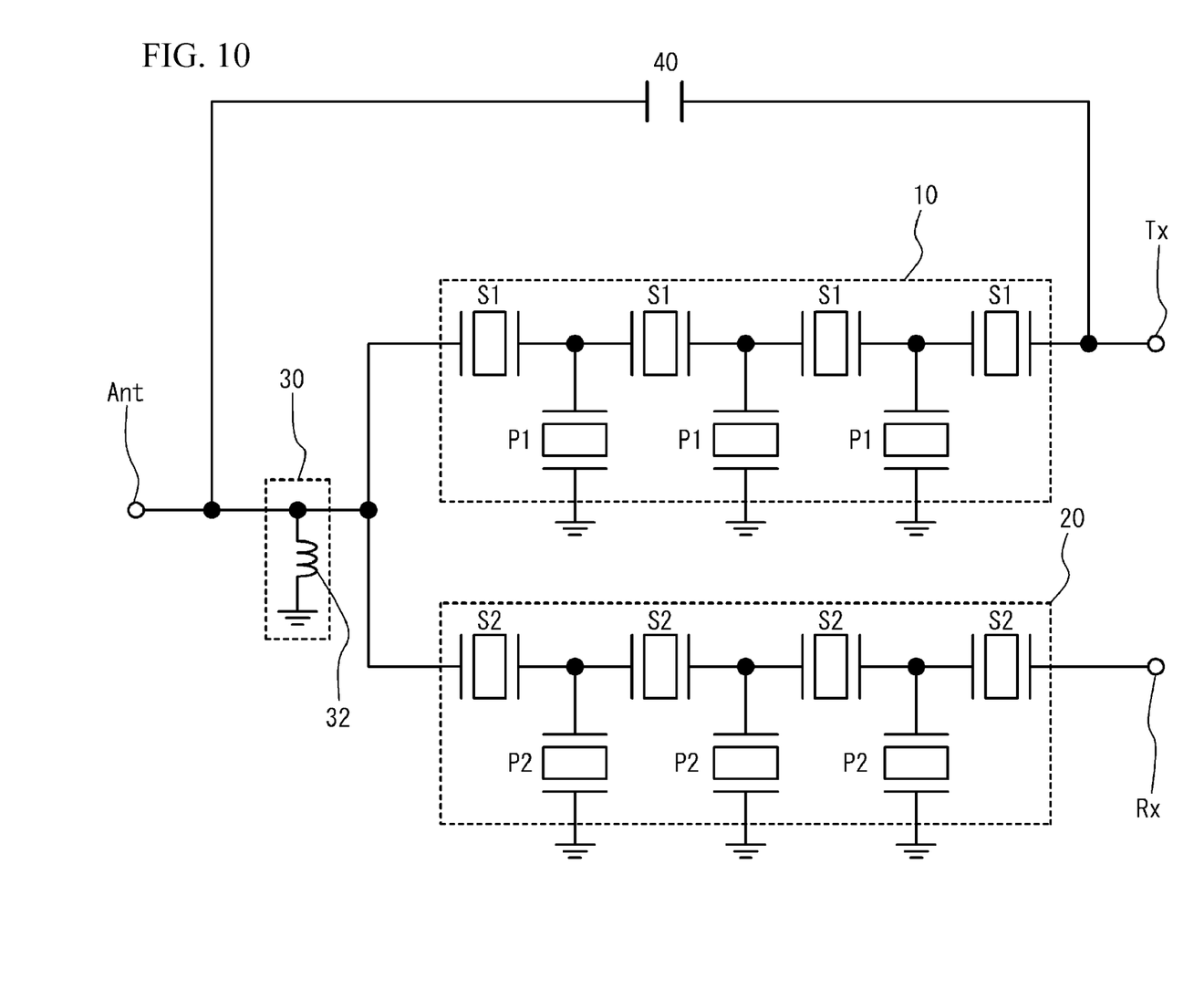
FIG. 10 is a diagram that illustrates yet another duplexer in accordance with the embodiment 1.

FIG. 10 illustrates yet another example of the embodiment 1. As illustrated in FIG. 10, the capacitor 40 may be connected in parallel with the transmission filter 10 between the common terminal Ant and the transmission terminal Tx. In the example illustrated in FIG. 10, some of the power of the reception signal applied to the common terminal Am reaches the transmission terminal Tx via the capacitor 40. This signal is capable of canceling the reception signal that leaks from the transmission filter 10 and reaches the reception terminal Rx. Thus, it is possible to improve the isolation characteristic from the reception terminal Rx to the transmission terminal Tx.

As illustrated in FIGS. 7, 9 and 10, the capacitor 40 may be connected in parallel with the transmission filter 10 or the reception filter 20 between at least two of the common terminal Ant, the transmission terminal Tx and the reception terminal Rx. Since the transmission signal input to the transmission terminal Tx is very greater than the reception signal input to the common terminal Ant, the isolation from the transmission terminal Tx to the reception terminal Rx is particularly likely to raise a problem. Thus, one end of the capacitor 40 is preferably connected to the reception terminal Rx.

When the transmission signal passes through both the transmission filter 10 and the reception filter 20, the phase of the transmission signal shifts greatly and the phase difference P is capable of becoming close to 180°. As illustrated in FIG. 7, the capacitor 40 is preferably connected between the transmission terminal Tx and the reception terminal Rx. Thus, downsizing may be achieved without the phase shift circuit or the like.

Embodiment 2

Figure 11:
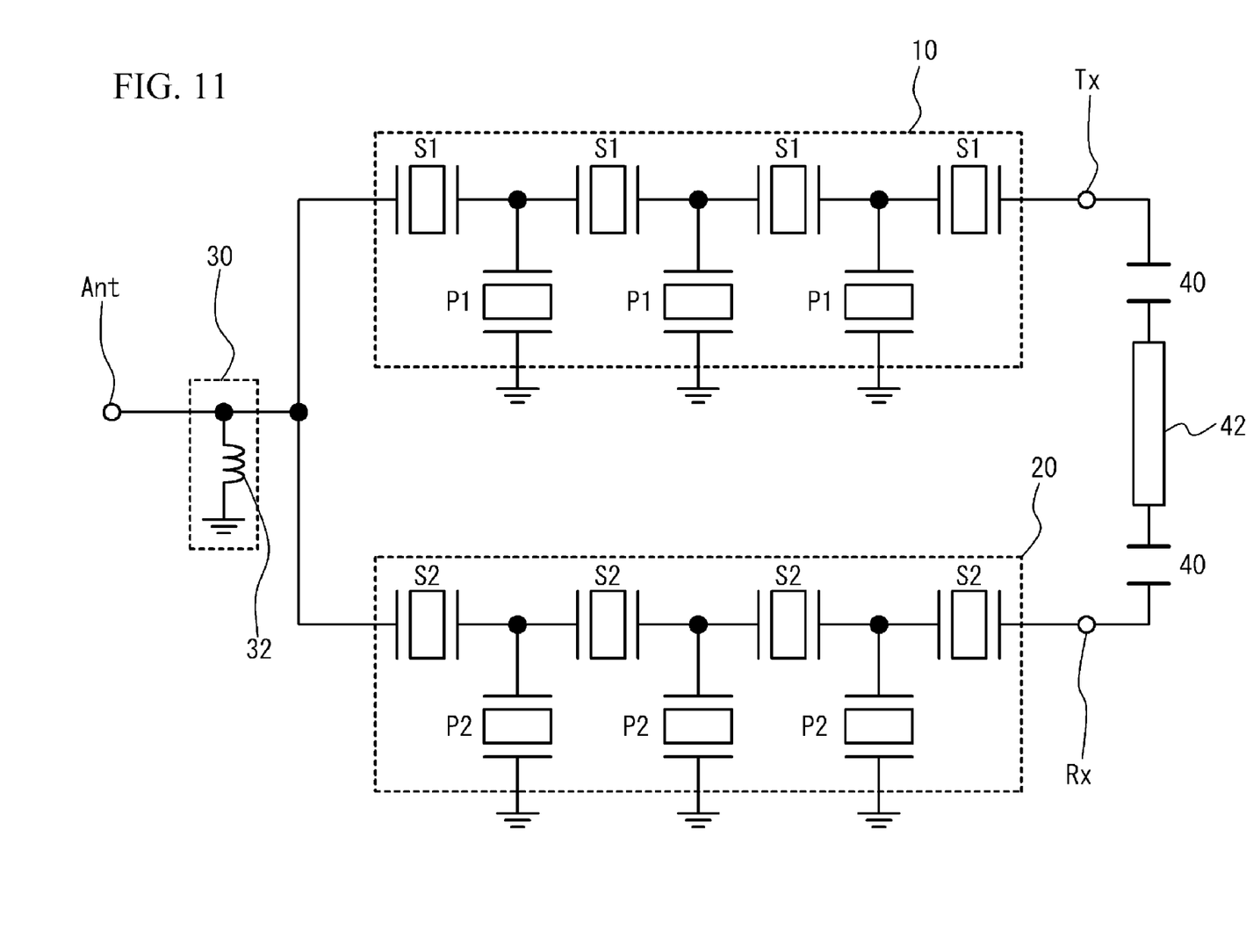
FIG. 11 is a diagram that illustrates a duplexer in accordance with an embodiment 2.

An embodiment 2 is an example configured to have a plurality of capacitors and a microstrip line is provided between the capacitors, FIG. 11 is a diagram of a circuit configuration of the embodiment 2. As illustrated in FIG. 11, a duplexer of the embodiment 2 has multiple capacitors 40. A microstrip line 42 is connected between the capacitors 40. The other structures are the same as those illustrated in FIG. 7 of the embodiment 1, and a description thereof is omitted here.

Figure 12A:
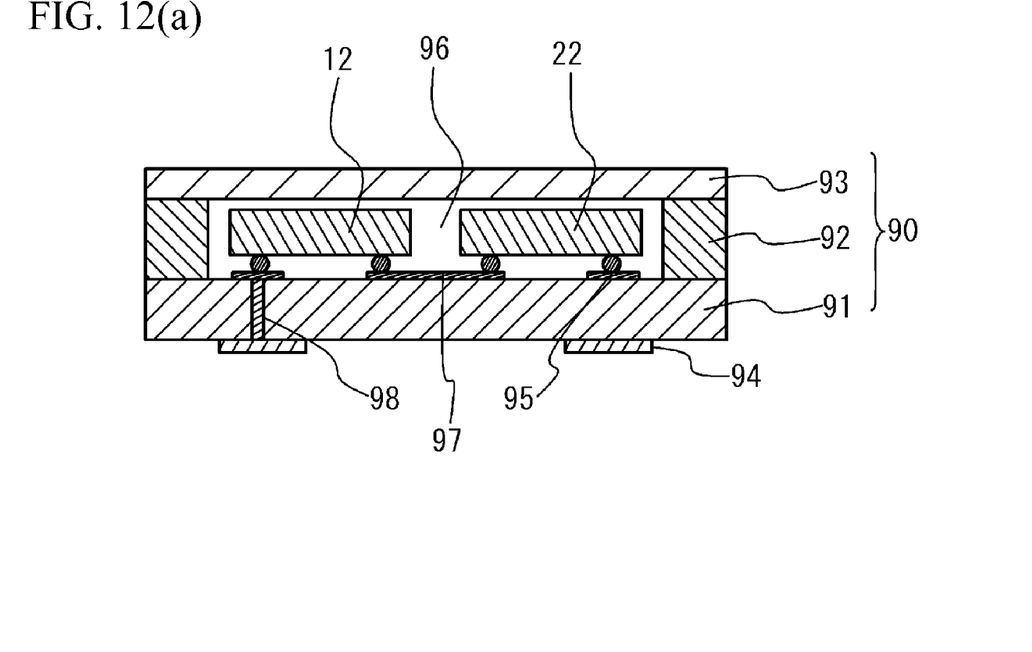
FIGS. 12(a) and 12(b) are respectively cross-sectional and plan views of the embodiment 2.
Figure 12B:
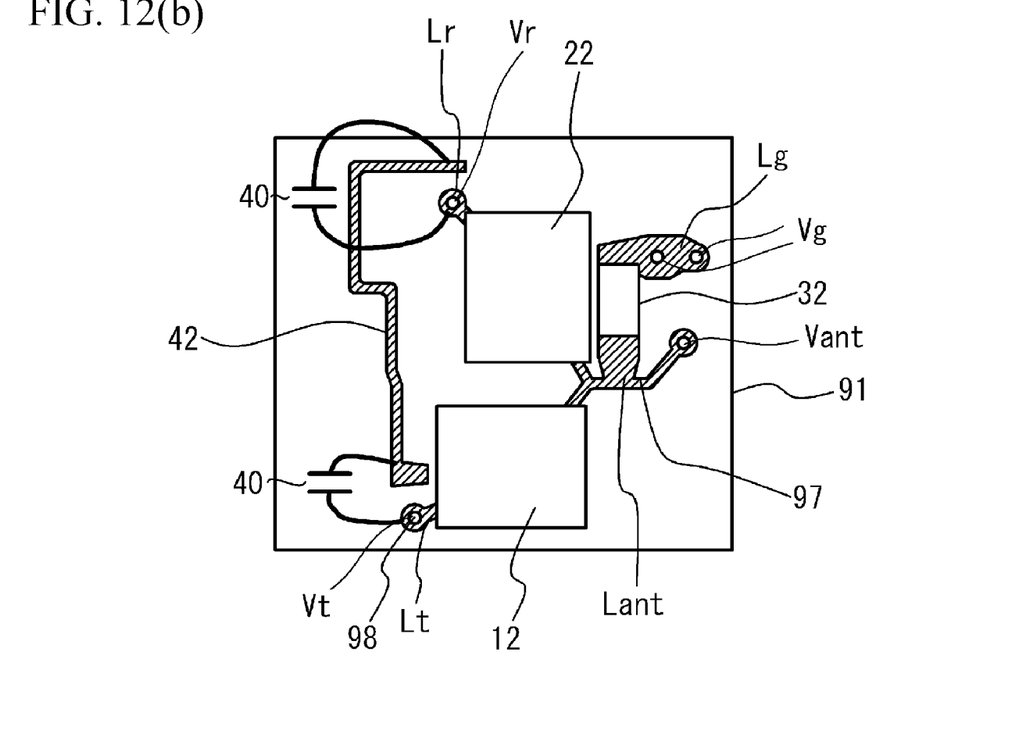

FIG. 12(a) is a cross-sectional view of the duplexer of the embodiment 2, and FIG. 12(b) is a plan view of a second layer 91. Referring to FIG. 12(a), a package 90 has a plurality of ceramic layers, which may be composed of a first layer 92 and the second layer 91. The first layer 92 defines a cavity 96 for sealing filter chips 12 and 22, A lid 93 is fixed to the top of the first layer 92, and the filter chips 12 and 22 are thus sealed. An interconnection 97 is formed on the surface of the second layer 91, The filter chips 12 and 22 are flip-chip mounted on the interconnection via bumps 95, Foot pads 94 are formed on the lower surface of the second layer 91. Vias 98 that pass through the second layer 91 and are full of a metal are formed. The transmission filter 10 is formed on the filter chip 12, and the reception filter 20 is formed on the filter chip 22.

Referring to FIG. 12(b), the filter chips 12 and 22 and the inductor 32 (inductor chip) are flip-chip mounted on the upper surface of the second layer 91. One end of the transmission filter 10 of the filter chip 12, one end of the reception filter 20 of the filter chip 22, and one end of the inductor 32 are connected to the foot pad 94 of the common terminal Ant via a line Lant of the interconnection 97 and a via Vain of one of the vias 98. The other end of the inductor 32 is connected to a ground foot pad via a line Lg of the interconnection 97 and a via Vg of one of the vias 98. The other end of the transmission filter 10 of the filter chip 1 is connected to the foot pad 94 of the transmission terminal Tx via a line Lt of the interconnection 97 and a via Vt of one of the vias 98. The other end of the reception filter 20 of the filter chip 22 is connected to the foot pad 94 of the reception terminal Rx via a line Lr of the interconnection 97 and a via Vi of one of the vias 98. The microstrip line 42 is spaced apart from the lines Lt and Lr, and these spaces form the capacitors 40.

The duplexer of the embodiment 2 and a comparative example having the microstrip line were manufactured and the isolation characteristics thereof were measured. The ratio Cpt/Cst between the capacitance of the parallel resonators P1 of the manufactured transmission filter 10 and the capacitance Cst of the series resonators S1 thereof was equal to 0.3. The ratio Cpr/Csr between the capacitance Cpr of the parallel resonators P2 of the manufactured reception filter 20 and the capacitance Csr of the series resonators S2 was equal to 0.8, The characteristic impedance of the microstrip line 42 was 26 Ω, and the spaces between the microstrip line 42 and the lines Lt and Lr that form the capacitors 40 were approximately 100 μm. Glass ceramic was used for the second layer 91.

Figure 13:
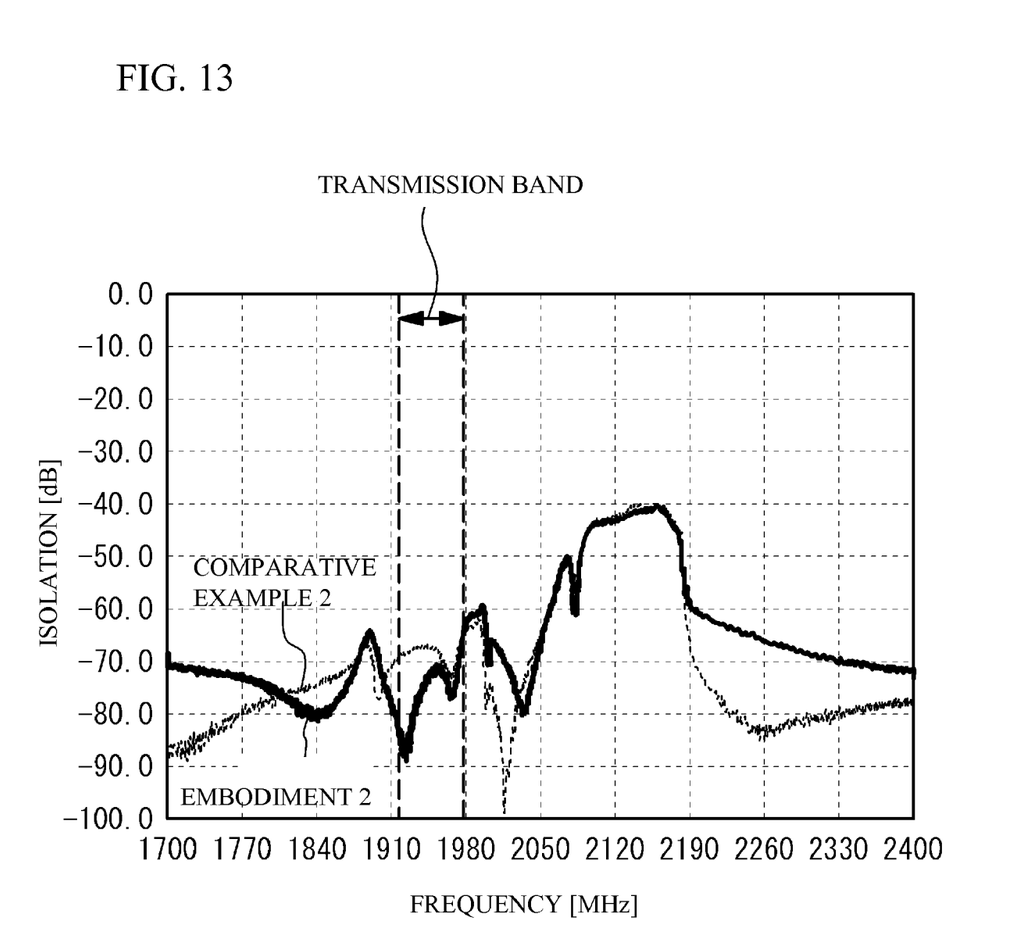
FIG. 13 is a diagram that illustrates isolation characteristics of the embodiment 2 and comparative example 2.

FIG. 13 is a diagram that illustrates a frequency dependence of isolation in the embodiment 2 (solid line) and the comparative example 2 (dashed line). The isolation in the transmission band in the example 2 is improved by 4 dB, as compared with the comparative example 2, As described above, even in the embodiment 2, the isolation characteristic can be improved.

It is required that the amplitude A of the signal after passing through the capacitor 40 is approximately equal to the amplitude of the transmission signal that leaks from the reception filter 20. Thus, the capacitance value of the capacitor 40 is as very small as fF. Thus, as in the case of the embodiment 2 it is preferable that the capacitors 40 are each formed by two lines formed on the same surface of the insulation layer (second layer 91) in the package 90. It is thus possible to realize the capacitances having small capacitance values.

It is preferable that the capacitance is realized by connecting multiple capacitors 40 in series. It is thus possible to realize the capacitor between the terminals having a small capacitance value.

The lines Lant, Lt and Lr are spaced. apart from each other in order to suppress the interference between the lines. When at lest two of the lines Lant, Lt and hr are coupled via a capacitance, a line for connecting the at least two of the lines Lant. Lt and Lr is provided. The two capacitors 40 are provided in the vicinities of the vias Vant, Vt and Vr, and two capacitors 40 are connected by the microstrip line 42. That is, the two capacitors 40 are formed by two of the lines Lant, Lt and Lr formed on the surface of the insulation layer (second layer 91) and both ends of the microstrip line 42. It is thus possible to reduce the area for arranging the capacitors 40. The microstrip line 42 may transmit a signal for suppressing isolation. The characteristic impedance of the microstrip line 42 is not limited specifically as long as the above signal is transmitted.

The duplexers of the embodiments 1 and 2 may be used for electronic devices such as cellular phones that have been described with reference to FIG. 2.

The embodiments of the present invention have been described. The present invention is not limited to these specific embodiments but may be varied or changed within the scope of the claimed invention.

What is claimed is:

1. A duplexer comprising:
   a transmission filter connected between a common terminal and a transmission terminal;
   a reception filter connected between the common terminal and a reception terminal;
   a capacitor connected in parallel with the transmission filter and the reception filter between the transmission terminal and the reception terminal and has a capacitance so that a phase difference between a signal passing from the transmission terminal to the reception terminal through the transmission filter and the reception filter and a signal passing from the transmission terminal to the reception terminal through the capacitor is a range of 180±85°, or connected in parallel with the reception filter between the common terminal and the reception terminal and has a capacitance so that a phase difference between a signal passing from the common terminal to the reception terminal through the reception filter and a signal from the common terminal to the reception terminal through the capacitor is a range of 180±85°; and
   a package on which the transmission filter and the reception filter are mounted, the package including the capacitor.

2. The duplexer according to claim 1, wherein a plurality of capacitors each being said capacitor are connected in series.

3. The duplexer according to claim 1, wherein the capacitor is formed by two lines formed on an identical surface of an insulation layer within the package.

4. The duplexer according to claim 1, wherein the capacitor is connected between the transmission terminal and the reception terminal.

5. A duplexer comprising:
   a transmission filter connected between a common terminal and a transmission terminal;
   a reception filter connected between the common terminal and a reception terminal;
   a capacitor connected in parallel with one of the transmission filter and the reception filter between at least two terminals out of the common terminal, the transmission terminal and the reception terminal;
   a package on which the transmission filter and the reception filter are mounted, the package including the capacitor; and
   a microstrip line formed on a surface of an insulation layer within the package,
   a plurality of capacitors each being said capacitor being connected in series, the plurality of capacitors being respectively connected to two of the common terminal, the transmission terminal and the reception terminal, and being formed by lines formed on the surface of the insulation layer and both ends of the microstrip line.

6. An electronic device comprising:
   a duplexer;
   a transmission circuit connected to the duplexer; and
   a reception circuit connected to the duplexer,
   the duplexer including:
   a transmission filter connected between a common terminal and a transmission terminal connected to the transmission circuit;
   a reception filter connected between the common terminal and a reception terminal connected to the reception circuit;
   a capacitor connected in parallel with the transmission filter and the reception filter between the transmission terminal and the reception terminal and has a capacitance so that a phase difference between a signal passing from the transmission terminal to the reception terminal through the transmission filter and the reception filter and a signal passing from the transmission terminal to the reception terminal through the capacitor is a range of 180±85°, or connected in parallel with the reception filter between the common terminal and the reception terminal and has a capacitance so that a phase difference between a signal passing from the common terminal to the reception terminal through the reception filter and a signal from the common terminal to the reception terminal through the capacitor is a range of 180±85°; and
   a package on which the transmission filter and the reception filter are mounted, the package including the capacitor.

\* \* \* \* \*